(12) United States Patent
Toyama

(10) Patent No.: US 6,475,354 B1
(45) Date of Patent: *Nov. 5, 2002

(54) DEPOSITED FILM PRODUCING PROCESS, PHOTOVOLTAIC DEVICE PRODUCING PROCESS, AND DEPOSITED FILM PRODUCING SYSTEM

(75) Inventor: Noboru Toyama, Hirakata (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/111,729

(22) Filed: Jul. 8, 1998

(30) Foreign Application Priority Data

Jul. 10, 1997 (JP) .............................................. 9-185044

(51) Int. Cl.[7] .............................................. C23C 14/34
(52) U.S. Cl. ........................... 204/192.13; 204/192.15; 204/192.29; 204/298.03; 204/298.07; 204/298.24
(58) Field of Search ....................... 204/192.12, 192.13, 204/192.15, 192.17, 192.26, 192.27, 192.29, 298.03, 298.07, 298.12, 298.15, 298.16, 298.17, 298.21, 298.22, 298.23, 298.24, 298.25, 298.28; 118/723; 438/57; 427/74; 136/243, 252

(56) References Cited

U.S. PATENT DOCUMENTS

| 4,356,073 A | 10/1982 | McKelvey | 204/192 R |
| 4,422,916 A | 12/1983 | McKelvey | 204/192 R |
| 4,888,199 A | * 12/1989 | Felts et al. | 204/192.13 |
| 5,538,905 A | * 7/1996 | Nishioka et al. | 204/192.29 |
| 5,614,248 A | * 3/1997 | Schiller et al. | 204/192.13 |
| 5,616,225 A | * 4/1997 | Sieck et al. | 204/298.14 |
| 6,054,024 A | * 4/2000 | Toyama et al. | 204/192.29 |

OTHER PUBLICATIONS

J. Czukor, et al., "The Effects of Process Conditions on the Quality and Deposition Rate of Sputtered ITO Coating", Society of Vacuum Coaters, 1991, pp. 190–195.
S. Schiller, "Progress in the Application of the Plasma Emmission Monitor in Web Coating", Second International Conference on Vacuum Web Coating, 1988, pp. 124–138.

* cited by examiner

Primary Examiner—Patrick Ryan
Assistant Examiner—Gregg Cantelmo
(74) Attorney, Agent, or Firm—Fitzpatrick, Cella, Harper & Scinto

(57) ABSTRACT

This invention relates to a deposited film producing process that enables reduction of the time for adjusting the conditions for film formation, and brings about an improvement in the reproducibility of film thickness and film quality of the deposited film formed. This process comprises the steps of, in the state where a substrate is set in a film-forming chamber, introducing a sputtering gas containing no reactive gas into the film-forming chamber and causing discharge therein, adjusting the sensitivity of a device for monitoring emission intensity of plasma of the discharge, in such a way that the device reads a set value, and introducing at least a reactive gas into the film-forming chamber to deposit a film on the substrate by subjecting a target to sputtering while controlling the feed rate of the reactive gas in such way as to provide a constant deposition rate.

13 Claims, 4 Drawing Sheets

U.S. 6,475,354 B1

DEPOSITED FILM PRODUCING PROCESS, PHOTOVOLTAIC DEVICE PRODUCING PROCESS, AND DEPOSITED FILM PRODUCING SYSTEM

BACKGROUND OF THE INVENTION

1. Field of the Invention

This invention relates to a sputtering system having a plasma emission monitor and a process for producing deposited films by using the system.

2. Related Background Art

In the production of transparent conductive films, a vacuum vapor deposition process making use of electron beam heating and a sputtering process of, e.g., a DC magnetron type are in wide use. Vapor deposition, however, is commonly unsuitable for mass production because the transparent conductive films are formed at a low deposition rate. On the other hand, DC magnetron sputtering can form the films at a higher deposition rate. In this process, an electric power is applied between a target and a substrate or a vacuum chamber to cause plasma of sputtering gas to sputter the target.

ITO (indium-tin oxide) films, an example of the transparent conductive films, are widely used as transparent electrodes for, e.g., liquid-crystal display devices, electroluminescent (EL) display devices, electrochromic display devices, photosensors and solar cells. When such ITO films are deposited by DC magnetron sputtering, a reactive sputtering process using a metallic indium 90: tin 10 target or sputtering process using an ITO ceramic target is available. It is reported that the former process can enjoy a lower target cost than the latter process and is suitable for mass production (J. Czukor, W. Kittler, P. Maschwitz and I. Ritchie, "The Effects of Process Conditions on the Quality and Deposition Rate of Sputtered ITO Coatings", Proc. Annu. Tech. Conf. Soc. Vac. Coaters, Vol. 34th, pp.190–195, 1991).

In the reactive sputtering, it is known to use a Plasma Emission Monitor (PEM) to control the flow rate of reactive gas (S. Schiller, "Progress in the Application of the Plasma Emission Monitor in Web Coating", 2nd Int. Conf. on Vacuum Web Coating, 1988). The PEM is a device for monitoring electric signals of plasma emission whose light is collected by a collimator and photoelectrically converted by a photomultiplier tube (PM) (or multiplier phototube). The PEM is so designed as to be set at a certain sensitivity to monitor the emission intensity of plasma. Using the PEM, the feed and flow rate of reactive gas, i.e., oxygen gas, are so very delicately regulated that the plasma emission intensity can be kept constant, whereby a homogeneous film can be formed.

Meanwhile, a DC magnetron sputtering system using a cylindrical rotary target is also known in the art. Use of this system is known to enable achievement of a higher deposition rate and a higher target utilization efficiency (U.S. Pat. Nos. 4,356,073 and 4,422,916).

Hitherto, when ITO films are deposited on substrates by magnetron sputtering, conditions such as electric power to be applied, flow rate of sputtering gas and sensitivity of PEM are kept fixed even when substrates are changed. Then, it has been difficult to keep the film thickness of each deposited film constant on each substrate. Non-uniformity in film thickness, especially of ITO films deposited on the surfaces of photovoltaic devices, may bring about interference color of light to cause a poor appearance. This non-uniformity appears especially when films are formed over a long time as in the case where thick films are formed, or where films are formed on continuous-sheet substrates, using a rotary target in both cases.

SUMMARY OF THE INVENTION

Accordingly, an object of the present invention is to provide a sputtering process that can be free from any difference in film thickness and layer quality even after films are formed over a long time.

To achieve the above object, the present invention provides a process for producing a deposited film, comprising the steps of:

in the state where a substrate is set in a film-forming chamber, introducing a sputtering gas containing no reactive gas into the film-forming chamber and causing discharge therein;

adjusting the sensitivity of a device for monitoring emission intensity of plasma of the discharge, in such a way that the device reads a set value; and introducing at least a reactive gas into the film-forming chamber to deposit a film on the substrate by subjecting a target to sputtering while controlling the feed rate of the reactive gas in such way as to provide a constant deposition rate.

The present invention also provides a process for producing a photovoltaic device having at least a substrate, a semiconductor layer and a transparent electrode; the transparent electrode being formed by a process comprising the steps of:

in the state where a substrate having a semiconductor layer is set in a film-forming chamber, introducing a sputtering gas containing no reactive gas into the film-forming chamber and causing discharge therein;

adjusting the sensitivity of a device for monitoring emission intensity of plasma of the discharge, in such a way that the device reads a set value; and introducing at least a reactive gas into the film-forming chamber to form a transparent electrode on the substrate having a semiconductor layer by subjecting a target to sputtering while controlling the feed rate of the reactive gas in such way as to provide a constant deposition rate.

The present invention still also provides a deposited film producing system comprising a film-forming chamber, means for holding a substrate in the film-forming chamber, means for monitoring emission intensity of discharged plasma the sensitivity of which is adjustable, a gas feed means, means for measuring deposition rate, means for controlling the feed rate of a reactive gas in such way as to provide a constant deposition rate, and means for subjecting a target to sputtering to deposit a film on the substrate.

DESCRIPTION OF THE PREFERRED EMBODIMENTS

Batch-type Sputtering System

A DC magnetron sputtering system according to an embodiment of the present invention and an ITO reactive sputtering process as an example of film production making use of the system will be described with reference to FIG. 1. Deposited films are by no means limited to the ITO films.

Figure 1:
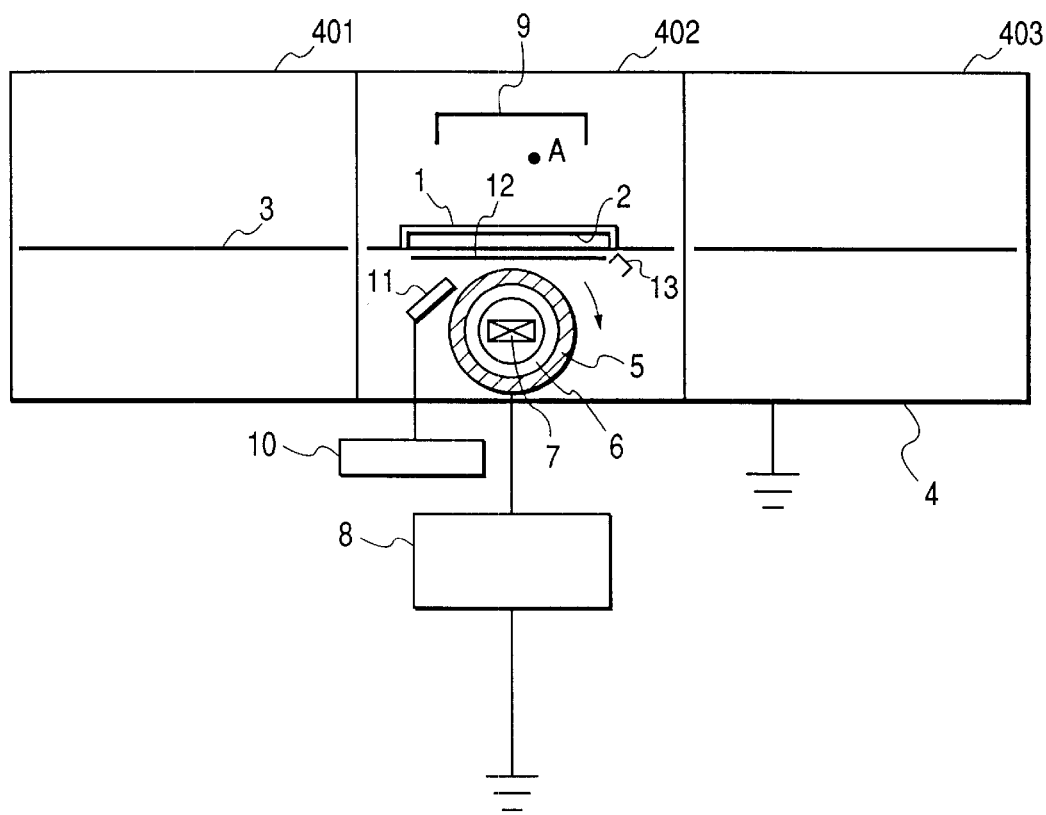
FIG. 1 is a diagrammatic cross-sectional view showing an example of the deposited film producing system (batch type) of the present invention.

FIG. 1 is a diagrammatic cross-sectional view showing an example of the batch-type DC magnetron sputtering system of the present invention. A vacuum chamber 4 consists of a substrate delivery load lock chamber 401, a film-forming chamber 402 and a substrate unloading load lock chamber 403 the insides of which are each evacuated by means of a vacuum pump (not shown). A substrate 2 is made of, e.g., glass, and is attached to a substrate holder 1. The substrate holder 1 is successively transported from the left to the right as viewed in FIG. 1, along a substrate holder transport guide 3.

A collimator 11 is directed toward plasma being discharged. This collimator 11 is the point at which the plasma emission intensity is measured in the present invention. Plasma emission spectra obtained through the collimator 11 are converted into electric signals through a filter and a photomultiplier (both not shown), which are then taken into a plasma emission monitor 10. Using this plasma emission monitor 10, the feed and flow rate of reactive gas is so controlled that the emission intensity of a substance noted in the plasma can always be constant. For example, when ITO films are formed, attention is paid to the emission spectrum of indium, and a filter for wavelength of 451 nm which is the emission spectrum of indium may be used.

In the present embodiment, a cathode 6 has the shape of a cylinder, and a target 5 is bonded around it. The cathode 6 is internally provided with a magnet 7 and a cooling means (not shown). A DC power source 8 is connected in the given direction between the cathode 6 and earth (or ground) potential, where the vacuum chamber 4 serves as the anode and an electric power is applied between the cathode 6 and the vacuum chamber 4.

As a heater 9, a sheathed heater is used in the present embodiment. The heater 9 is so controlled that the value indicated by a thermocouple installed at a point A in the empty space right beneath the heater 9 can be constant. As a film thickness monitor 13, a quartz vibrator film thickness monitor is used. The film thickness monitor 13 is installed at the position where the film thickness can always be measured without regard to the opening or closing of a shutter 12. Meanwhile, the film thickness monitor has its own shutter (not shown).

Figure 2:
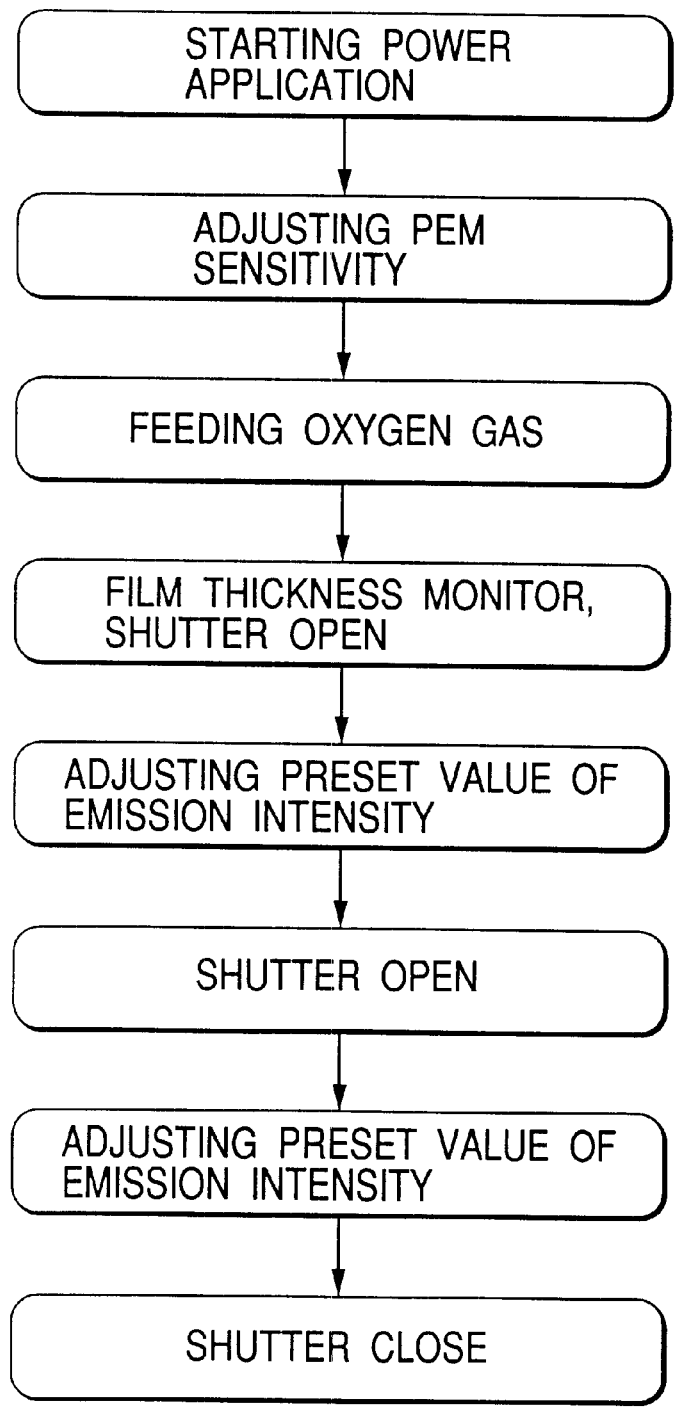
FIG. 2 is a flow chart showing an example of the deposited film producing process of the present invention.

The system constituted as described above is so controlled as to operate every time along the flow shown in FIG. 2, by means of a computer at least after the electric power is started to be applied to the cathode and until the film formation is completed. More specifically, the substrate is set and then the electric power is applied. Making sure that the electric power has reached a predetermined level, the sensitivity of the Plasma Emission Monitor (PEM) is adjusted before oxygen gas is introduced.

With repetition of sputtering, the emission intensity (apparent emission intensity) of plasma may change even under the same conditions. Such a change is presumed to be caused by a change in surface state of the target as a result of sputtering. Then, the quality of plasma under certain conditions before oxygen gas is introduced stands unchanged even though the apparent emission intensity of plasma has changed. Thus, the sensitivity is adjusted so that the film formation may not be affected by such a change in apparent emission intensity.

Stated specifically, the sensitivity of the PEM is so adjusted that the value indicated by the PEM can be constant even when plasma is generated under conditions of predetermined applied power, sputtering gas and pressure and the emission intensity of plasma changes after the substrate is replaced with another. After its sensitivity has been so adjusted that the PEM indicates a certain value according to the emission intensity under the above stated conditions, the reactive gas oxygen is introduced. After the reaction has become stable, the shutter of the film thickness monitor 13 is opened and the deposition rate is measured. The set value of the emission intensity of plasma is so adjusted that a deposition rate previously set can be identical with a deposition rate found in the course of measurement. Namely, the set value of the emission intensity is lowered when the deposition rate is high, and the set value is raised when the deposition rate is small. After the set value of the plasma emission intensity has been so adjusted that the deposition rate comes to be a desired value, the shutter 12 is opened. During the film formation, the set value of the emission intensity is always so adjusted that the deposition rate can be identical with the set value. Stated specifically, the flow rate of the reactive gas oxygen is so controlled that the emission intensity is always constant. Since the change in oxygen gas flow rate is in a very small amount, it by no means greatly changes the film quality. Finally, at the time the film has come to have a predetermined film thickness, the shutter 12 is closed. Using the system as described above, the sensitivity of the PEM is adjusted every time the substrate is replaced with another, where the transparent conductive film ITO is formed. The sensitivity is adjusted in this way, thus the film formation may no longer be affected by the change in the apparent emission intensity.

Roll-to-roll Sputtering System

Figure 3:
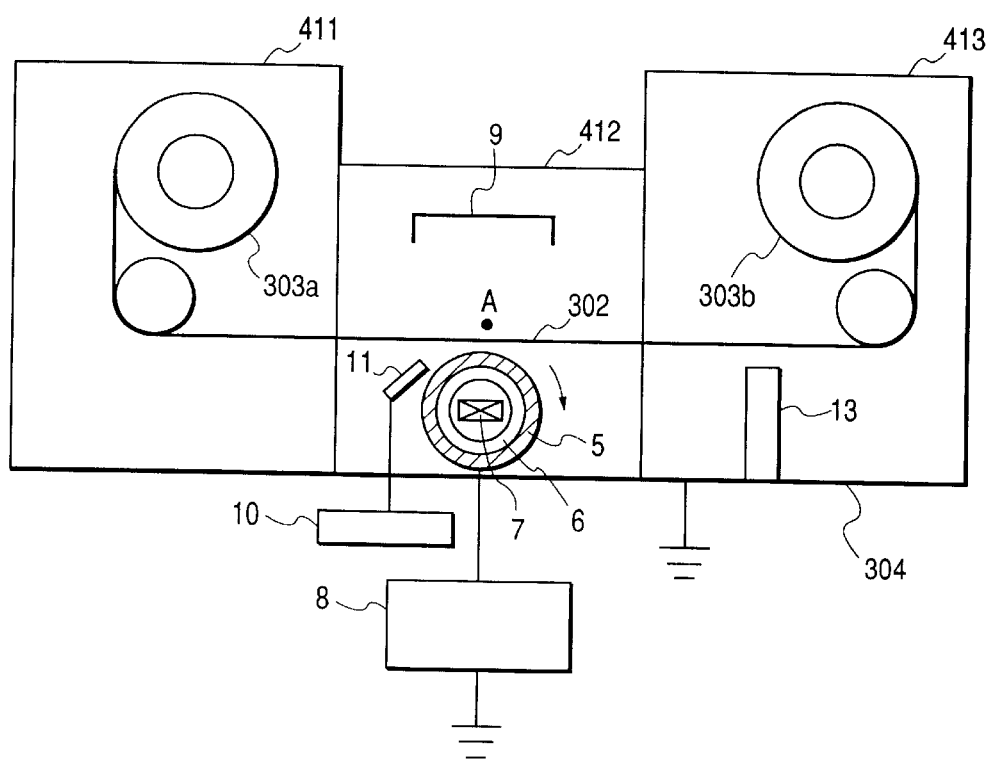
FIG. 3 is a diagrammatic cross-sectional view showing an example of a roll-to-roll type system in the deposited film producing system of the present invention.

FIG. 3 is a diagrammatic cross-sectional view of a roll-to-roll type DC magnetron sputtering system making use of a cylindrical rotary target. A vacuum chamber 304 consists of a substrate delivery chamber 411, a film-forming chamber 412 and a substrate wind-up chamber 413 the insides of which are each evacuated by means of a vacuum pump (not shown).

A continuous-sheet substrate 302 is wound around a substrate delivery roll 303a, is delivered by a transport means (not shown) and is wound up on a substrate wind-up roll 303b as shown in FIG. 3. Other constituents may be the same as those of the batch type sputtering system.

Figure 5:
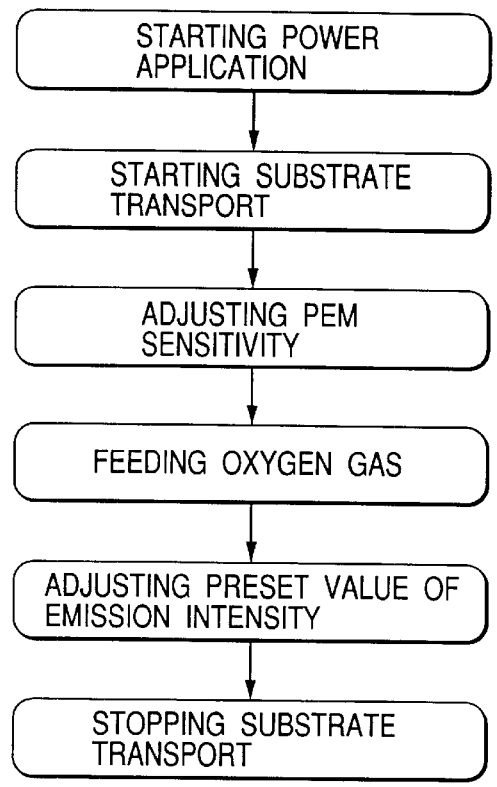
FIG. 5 is a flow chart showing an example of the deposited film producing process of the present invention.

The system constituted as described above is so controlled as to operate every time along the flow shown in FIG. 5, by means of a computer at least after the electric power is started to be applied to the cathode and until the film formation is completed. More specifically, making sure that the electric power has reached a predetermined level after the electric power is started to be applied, the sensitivity of the PEM is adjusted.

The sensitivity of the PEM is so adjusted that the value indicated by the PEM can be constant even when the emission intensity of plasma generated under conditions of predetermined applied power, sputtering gas and pressure changes after the substrate is replaced with another. After its sensitivity has been so adjusted that the PEM indicates a certain value according to the emission intensity under the above stated conditions, the reactive gas oxygen is introduced. After the reaction has become stable, the film thickness is measured with a film thickness monitor 13. The set value of the emission intensity of plasma is so adjusted that a film thickness previously set can be identical with a film thickness found in the course of measurement. Namely, the set value of the emission intensity is lowered when the film thickness is large, and the set value is raised when the film thickness is small. During the film formation, the set value of the emission intensity is always so adjusted that the film thickness can be identical with the set value. Stated specifically, the flow rate of the reactive gas oxygen is so controlled that the emission intensity is always constant. Since the change in oxygen gas flow rate is in a very small amount, it by no means greatly changes the film quality. Finally, the film is formed until it comes to a predetermined substrate length. In an instance where an ITO film is continuously formed on a continuous-sheet substrate of at least about 100 m long, the film quality does not greatly differ between a spot on the continuous-sheet substrate where the film formation is started and a spot where the film formation is completed.

Application to Photovoltaic Device

ITO films are used as transparent electrodes provided on the light-incident side of photovoltaic devices that utilize semiconductor pn junction, pin junction or Schottky junction. On a transparent substrate made of, e.g., glass, an ITO film, semiconductor layers and a back electrode are formed in this order. On a substrate made of, e.g., metal or resin, a back electrode, semiconductor layers and an ITO film are formed in this order. The photovoltaic devices may be produced by forming non-single-crystal semiconductor layers by CVD on metal substrates made of, e.g., stainless steel. Such a process is preferred because of its high productivity. In this instance, it is preferable for the film to be continuously formed on a continuous-sheet substrate. The ITO films in photovoltaic devices function not only as electrodes for taking out electric power, but also as reflection preventive films when formed in an appropriate film thickness.

Application to Liquid-crystal Display Device

Two sheets of glass substrates on which ITO films are formed to form a desired pattern and alignment films are provided are set opposite one another with a gap between them, and a liquid-crystal material is injected into the gap. Thus, a transmission liquid-crystal display device can be produced.

The deposited film producing process of the present invention can be applied to the fabrication of the above photovoltaic devices and liquid-crystal display devices.

The present invention will be described below in greater detail by giving Examples. The present invention is by no means limited by these Examples.

EXAMPLE 1

In the present example, transparent conductive ITO films were repeatedly formed 50 times by the use of the system shown in FIG. 1. As the cathode 6, used was a cylindrical electrode made of stainless steel, having an external diameter of 20 cm, an internal diameter of 18 cm and a length of 50 cm and on the periphery of which a 6 mm thick target comprised of a 95:5% by weight indium:tin alloy was further bonded as the target 5. The cathode 6 was so set as to be rotatable at a speed of 3 rpm in the clockwise direction (in the direction of an arrow) as viewed on FIG. 1. Thus, the target 5 moved relatively with respect to the collimator 11, the plasma emission intensity measuring point. The target 5 and the substrate 1 were set at a distance of 100 mm. As the plasma emission monitor 10, PEM-04 (manufactured by Aldenne Co., Germany) was used.

The glass substrate 2 was attached to the substrate holder 1, which was then put into the substrate delivery load lock chamber 401. The chamber was evacuated to about 1 Torr by means of a vacuum pump (not shown). The gate valve provided between the load lock chamber 401 and the film-forming chamber 402 was opened, and the substrate holder having the substrate was transported to the film-forming chamber 402. After the substrate holder came to the predetermined position, the gate valve was closed. The film-forming chamber was evacuated until it reached a degree of vacuum of $10^{-5}$ Torr level, and thereafter argon gas was introduced. Here, the film-forming chamber was kept at a degree of vacuum of 3 mTorr.

The output of the heater 9 was so controlled that the thermocouple indicated a value of 350° C. One hour after the heater 9 was put on, film formation was started according to the procedure shown in FIG. 2. After the applied power reached 0.8 kW which was a set value of applied power, the sensitivity of the PEM 10 was so adjusted that the PEM read a mark of 600 indicating the plasma emission intensity. After adjustment, oxygen gas was introduced. One minute thereafter, the shutter of the film thickness monitor 13 was opened, and the oxygen gas feed rate was adjusted while monitoring the emission intensity of plasma, which was so adjusted as to provide a deposition rate of 15 angstroms/second. After adjustment, the shutter 12 was opened to start film formation. In the course of the film formation, too, the oxygen gas feed rate was adjusted while monitoring the emission intensity of plasma, so as to keep the deposition rate constant. At the time the film came to have a film thickness of 1,000 angstroms, the shutter 12 was closed.

After the film formation was completed, the substrate holder was sent to the substrate unloading load lock chamber 403. Thereafter, the next substrate was set, and the above procedure was repeated to form films 50 times in total.

Fifty samples thus obtained had a resistivity of (4.2 plus-minus 0.3)×$10^{-4}$ Ω·cm and a transmittance of 86% plus-minus 2% at wavelength of 550 nm. Thus, ITO films with a good reproducibility were obtained.

Comparative Example 1

The glass substrate 2 was attached to the substrate holder 1, which was then put into the substrate delivery load lock chamber 401. The chamber was evacuated to about 1 Torr by means of a vacuum pump (not shown). The gate valve provided between the load lock chamber 401 and the film-forming chamber 402 was opened, and the substrate holder having the substrate was transported to the film-forming chamber 402. After the substrate holder came to the predetermined position, the gate valve was closed. The film-forming chamber was evacuated until it reached a degree of vacuum of $10^{-5}$ Torr level, and thereafter argon gas was introduced. Here, the film-forming chamber was kept at a degree of vacuum of 3 mTorr.

The output of the heater 9 was so controlled that the thermocouple indicated a value of 350° C. One hour after the heater 9 was put on, film formation was started.

In the first-time film formation, after the applied power reached 0.8 kW which was a set value of applied power, the sensitivity of the PEM 10 was so adjusted that the PEM read a mark of 600 indicating the plasma emission intensity. After adjustment, oxygen gas was introduced. One minute thereafter, the shutter of the film thickness monitor 13 was opened, and the set value of the emission intensity of plasma was so adjusted as to provide a deposition rate of 15 angstroms/second. After adjustment, the shutter 12 was opened, and, at the time the film came to have a film thickness of 1,000 angstroms, the shutter 12 was closed.

After the film formation was completed, the substrate holder was sent to the substrate unloading load lock chamber 403. Thereafter, the next substrate was set, an electric power of 0.8 kW was applied, and the second film formation was conducted without adjusting the sensitivity of the PEM 10. Similarly, the third film formation was conducted without adjusting the sensitivity of the PEM 10. Here, the emission intensity of plasma before oxygen gas was introduced changed to 610 at the second time, and 630 at the third time. In the both film formation, the set value of plasma emission intensity was so adjusted as to provide a deposition rate of 15 angstroms/second, but it took a time about twice the time taken in Example 1, until the adjustment was completed. This was presumed to be due to the changes in apparent emission intensity which were caused even under the same conditions, when the sensitivity was not adjusted every time, and which caused the standard to deviate to make it necessary to change the set value of plasma emission intensity more greatly than that of the last film formation.

Three samples thus obtained had a resistivity of $4.2 \times 10^{-4}$ $\Omega \cdot cm$, $2.5 \times 10^{-4}$ $\Omega \cdot cm$ and $4.5 \times 10^{-4}$ $\Omega \cdot cm$ and a transmittance of 85%, 78% and 86% at wavelength of 550 nm, respectively, showing a great variance for each substrate.

EXAMPLE 2

In the present Example, ITO films were formed as transparent electrodes of photovoltaic devices each having a triple pin structure superposingly formed by a roll-to-roll method.

Photovoltaic Device

Figure 4:
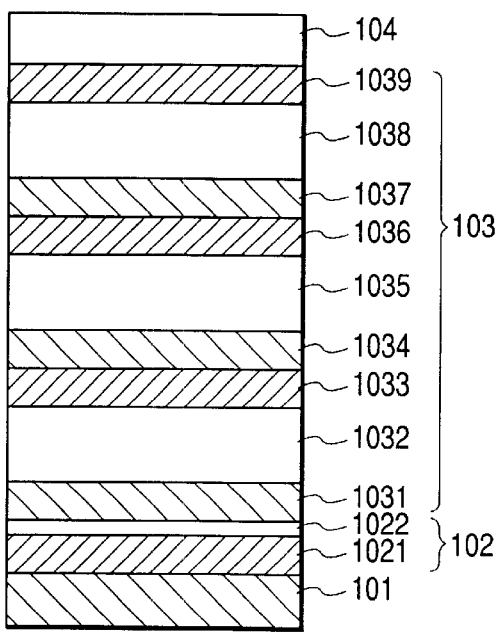
FIG. 4 is a diagrammatic cross-sectional view showing an example of a photovoltaic device formed by the deposited film producing process of the present invention.

As shown in FIG. 4, on a multi-layer structure comprised of a conductive substrate 101, a reflective layer 102 and a semiconductor layer 103, an ITO film 104 serving as a transparent electrode was formed by the system and process of the present invention.

As the conductive substrate 101, a stainless steel sheet (SUS430) of 0.2 mm thick, 360 mm wide and 300 m long whose surface had been Bright Annealing-treated was used. As the conductive substrate 101, not only the stainless steel sheet but also galvanized steel sheets, aluminum sheets and coated steel sheets may be used.

The reflective layer 102 consists of a metal layer 1021 formed of Al and a transparent conductive layer 1022 formed of ZnO. These layers were formed by sputtering.

The semiconductor layer 103 was comprised of a triple pin structure superposingly formed as shown in FIG. 4. More specifically, it was constituted of a bottom cell comprised of an n-type a-Si layer 1031, an i-type a-SiGe layer 1032 and a p-type a-Si layer 1033, a middle cell comprised of an n-type a-Si layer 1034, an i-type a-SiGe layer 1035 and a p-type a-Si layer 1036 and a top cell comprised of an n-type a-Si layer 1037, an i-type a-Si layer 1038 and a p-type a-Si layer 1039. These layers were formed by plasma enhanced CVD.

On the p-type a-Si layer 1039, the ITO film was formed using the roll-to-roll DC magnetron sputtering system shown in FIG. 3.

As the cathode 6, used was a cylindrical electrode made of stainless steel, having an external diameter of 20 cm, an internal diameter of 18 cm and a length of 50 cm and on the periphery of which a 6 mm thick target comprised of a 95:5% by weight indium:tin alloy was further bonded as the target 5. The cathode 6 was so set as to be rotatable at a speed of 3 rpm in the clockwise direction (in the direction of an arrow) as viewed on FIG. 3. Thus, the target 5 moved relatively with respect to the collimator 11, the plasma emission intensity measuring point. The target 5 and the substrate 1 were set at a distance of 70 mm. As the PEM 10, the same one as that used in Example 1 was used.

How to form the ITO film will be described below according to the procedure of formation. A continuous-sheet member on which films have been formed up to the semiconductor layer 103 is wound around the substrate delivery roll 303a, is delivered by a transport means (not shown) and is wound up on the substrate wind-up roll 303b as shown in FIG. 3.

The film-forming chamber was evacuated by means of a vacuum pump (not shown) until it reached a degree of vacuum of $10^{-5}$ Torr level, and thereafter argon gas was introduced. Here, the film-forming chamber was kept at a degree of vacuum of 2.5 mTorr.

The output of the heater 9 was so controlled that the thermocouple indicated a value of 210° C. One hour after the heater 9 was put on, film formation was started. Thereafter, the film formation was automatically carried out according to the procedure shown in FIG. 5.

After the applied power reached 1.8 kW which was a set value of applied power, and the substrate was transported at a speed of 30 inches/minute. The sensitivity of the PEM 10 was so adjusted that the PEM read a mark of 600 indicating the plasma emission intensity. After adjustment, oxygen gas was introduced. One minute thereafter, the set value of plasma emission intensity was so adjusted as to provide a film thickness of 70 nm obtained by measuring its reflectance with the film thickness monitor 13. The ITO film was formed by 200 m in length of the substrate while always adjusting the feed rate of oxygen gas.

The sample thus obtained was cut at intervals of 10 m, and sheet resistivity was measured for each cut sample to find that it was stable at 120±10 $\Omega$/square.

Next, the film formation was repeated five times in the same manner as the above. The samples thus obtained were each cut at intervals of 10 m, and sheet resistivity was measured for each cut sample to find that it was 120±10 $\Omega$/square. Thus, stable ITO films were obtained in a good reproducibility.

Comparative Example 2

In the same manner as in Example 2, the continuous-sheet member on which the semiconductor layer 103 had been formed was wound around the substrate delivery roll 303a, and was so set as to be delivered by a transport means (not shown) and wound up on the substrate wind-up roll 303b as shown in FIG. 3.

The film-forming chamber was evacuated by means of a vacuum pump (not shown) until it reached a degree of vacuum of $10^{-5}$ Torr level, and thereafter argon gas was introduced. Here, the film-forming chamber was kept at a degree of vacuum of 2.5 mTorr.

The output of the heater 9 was so controlled that the thermocouple indicated a value of 210° C. One hour after the heater 9 was put on, film formation was started. Thereafter, the film formation was automatically carried out according to the procedure shown in FIG. 5.

In the first-time film formation, after the applied power reached 1.8 kW which was a set value of applied power, the substrate was transported at a speed of 30 inches/minute, and the sensitivity of the PEM 10 was so adjusted that the PEM read a mark of 600 indicating the plasma emission intensity. After adjustment, oxygen gas was introduced. One minute thereafter, the set value of plasma emission intensity was so adjusted as to provide a film thickness of 70 nm obtained by measuring its reflectance with the film thickness monitor 13. The ITO film was formed by 200 m in length of the substrate while always making the adjustment.

Next, in the second- and third-time film formation, films were formed without adjusting the sensitivity of the PEM. Here, the emission intensity of plasma before oxygen gas was introduced changed to 700 at the second time, and 820 at the third time. In the both film formation, the set value of plasma emission intensity was so adjusted as to provide a film thickness of 70 nm, but it took a time about twice the time taken in Example 2, until the adjustment was completed. This caused defectives over a length of nearly 10 m. This was presumed to be due to the changes in apparent emission intensity which were caused even under the same conditions, when the sensitivity was not adjusted every time, and which caused the standard to deviate to make it necessary to change the set value of plasma emission intensity more greatly than that of the last film formation.

The samples thus obtained were cut at intervals of 10 m, and sheet resistivity was measured for each cut sample to find that the values at the first time, second time and third time were 120±10 Ω/square, 80±10 Ω/square and 50±20 Ω/square, respectively. It was true that the sheet resistivity lowered, but the characteristics of solar cells (photovoltaic devices) became lower at the second time than at the first time, and at the third time than at the second time. This was presumably because the transmittance became lower concurrently when the sheet resistivity lowered.

As having been described above, in the formation of transparent conductive films by using the sputtering system making use of the Plasma Emission Monitor (PEM) and by the reactive sputtering making use of such a system, the sensitivity of the PEM is adjusted every time the substrate is replaced with another, whereby the conditions for film formation can be adjusted in a short time. Thus, films can be formed while making good use of time and film thickness can be kept uniform. Also, adjusting the sensitivity every time makes it possible for the PEM to be less affected by the changes in plasma emission intensity that are presumed to be caused by changes in surface condition of the target which are presumed to be due to changes with time, bringing about an improvement in the reproducibility of sheet resistivity and/or transmittance of the transparent conductive films for each film formation.

What is claimed is:

1. A process for producing deposited films, each deposited film formed by a process comprising the steps of:
   setting a substrate in a film-forming chamber;
   introducing a sputtering gas containing no reactive gas into the film-forming chamber and causing discharge therein;
   adjusting a device for monitoring emission intensity of discharge plasma without the presence of a reactive gas, such that the device remains at a constant set value for each substrate set in the film-forming chamber; and
   after said adjusting introducing at least a reactive gas into the film-forming chamber to deposit a film on the substrate by subjecting a cylindrical target comprising an indium-tin alloy to sputtering, monitoring a rate of film deposition with a film thickness monitor and readjusting the device for monitoring emission intensity of discharge plasma by controlling the feed rate of the reactive gas to provide a constant pre-established film deposition rate and form an indium-tin oxide film on the substrate, wherein the substrate is transferred by a roll-to-roll system.

2. The process according to claim 1, wherein the sputtering is direct-current magnetron sputtering.

3. The process according to claim 1, wherein the substrate is a continuous-sheet substrate.

4. The process according to claim 1, wherein the step of depositing the film is the step of depositing films on a plurality of substrates by sputtering, and the step of adjusting the device is carried out every time after a substrate is replaced with another.

5. The process according to claim 3, wherein the step of depositing the film on a portion of the continuous-sheet substrate and the step of adjusting the device are repeated.

6. The process according to claim 1, wherein the sputtering gas containing no reactive gas comprises argon.

7. The process according to claim 1, wherein the reactive gas comprises oxygen.

8. The process according to claim 1, wherein the film deposited on the substrate is a transparent conductive film.

9. A process for producing photovoltaic devices, each said photovoltaic device having at least a substrate, a semiconductor layer and a transparent electrode; the transparent electrode for each said photovoltaic device being formed by a process comprising the steps of:
   setting a substrate having a semiconductor layer in a film-forming chamber, introducing a sputtering gas containing no reactive gas into the film-forming chamber and causing discharge therein;
   adjusting a device for monitoring emission intensity of discharge plasma without the presence of a reactive gas, such that the device remains at a constant set value for each said substrate set in the film-forming chamber; and
   after said adjusting, introducing at least a reactive gas into the film-forming chamber to form a transparent electrode on the substrate having a semiconductor layer by subjecting a rotating cylindrical target comprising an indium-tin alloy to sputtering, monitoring a rate of film deposition with a film thickness monitor and readjusting the device for monitoring emission intensity of discharge plasma by controlling the feed rate of the reactive gas to provide a constant pre-established deposition rate and form an indium-tin oxide transparent electrode on the substrate having the semiconductor layer, wherein the substrate is transferred by a roll-to-roll system.

10. A deposited film producing system comprising a film-forming chamber, means for holding a substrate in the film-forming chamber, means for monitoring emission intensity of discharged plasma, said means for monitoring adjustable to a constant set value without the presence of a reactive gas, a gas feed means, a film thickness monitor for monitoring a rate of film formation means for readjusting the sensitivity of the means for monitoring emission intensity of discharged plasma, means for controlling the feed rate of a reactive gas to provide a constant pre-established film deposition rate, and means for subjecting a rotating cylindrical target comprising an indium-tin alloy to sputtering to deposit a film comprising an indium-tin oxide on the substrate, wherein the substrate is transferred by a roll-to-roll system.

11. A process for producing deposited films, each deposited film formed by a process comprising the steps of:

setting a substrate in a film-forming chamber;

introducing a sputtering gas containing no reactive gas into the film-forming chamber and causing discharge therein;

adjusting a device for monitoring emission intensity of discharge plasma without the presence of a reactive gas, such that the device remains at a constant set value for each substrate set in the film-forming chamber when film deposition conditions are the same and although actual intensity of discharge plasma may vary; and after said adjusting introducing at least a reactive gas into the film-forming chamber to deposit a film on the substrate by subjecting a cylindrical target comprising an indium-tin alloy to sputtering, monitoring a rate of film deposition with a film thickness monitor and readjusting the device for monitoring emission intensity of discharge plasma by controlling the feed rate of the reactive gas to provide a constant pre-established film deposition rate and form an indium-tin oxide film on the substrate.

12. A process for producing photovoltaic devices, each said photovoltaic device having at least a substrate, a semiconductor layer and a transparent electrode; the transparent electrode for each said photovoltaic device being formed by a process comprising the steps of:

setting a substrate having a semiconductor layer in a film-forming chamber, introducing a sputtering gas containing no reactive gas into the film-forming chamber and causing discharge therein;

adjusting a device for monitoring emission intensity of discharge plasma without the presence of a reactive gas, such that the device remains at a constant set value for each said substrate set in the film-forming chamber when film deposition conditions are the same and although actual intensity of discharged plasma may vary; and after said adjusting introducing at least a reactive gas into the film-forming chamber to form a transparent electrode on the substrate having a semiconductor layer by subjecting a rotating cylindrical target comprising an indium-tin alloy to sputtering, monitoring a rate of film deposition with a film thickness monitor and readjusting the device for monitoring emission intensity of discharge plasma by controlling the feed rate of the reactive gas to provide a constant pre-established film deposition rate and form an indium-tin oxide transparent electrode on the substrate having the semiconductor layer.

13. A deposited film producing system comprising a film-forming chamber, means for holding a substrate in the film-forming chamber, means for monitoring emission intensity of discharged plasma, said means for monitoring adjustable to a constant set value without the presence of a reactive gas when film deposition conditions are the same and although actual discharge plasma intensity may vary, a gas feed means, a film thickness monitor for monitoring a rate of film formation means for readjusting the sensitivity of the means for monitoring emission intensity of discharged plasma, means for controlling the feed rate of a reactive gas to provide a constant pre-established film deposition rate, and means for subjecting a rotating cylindrical target comprising an indium-tin alloy to sputtering to deposit a film comprising an indium-tin oxide on the substrate.

* * * * *